(12) United States Patent
Wen et al.

(10) Patent No.: US 8,582,317 B2
(45) Date of Patent: Nov. 12, 2013

(54) METHOD FOR MANUFACTURING A SEMICONDUCTOR COMPONENT AND STRUCTURE THEREFOR

(75) Inventors: Yenting Wen, Chandler, AZ (US); Kisun Lee, Chandler, AZ (US); Michael Stapleton, Scottsdale, AZ (US); Gary H. Loechelt, Tempe, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 318 days.

(21) Appl. No.: 12/787,861

(22) Filed: May 26, 2010

(65) Prior Publication Data

US 2011/0292632 A1 Dec. 1, 2011

(51) Int. Cl.
*H05K 7/02* (2006.01)
*H01L 21/50* (2006.01)
*H01L 23/48* (2006.01)
*H01L 21/77* (2006.01)

(52) U.S. Cl.
USPC ............ 361/820; 361/764; 361/782; 361/813

(58) Field of Classification Search
USPC .................. 257/107, 676, 666; 438/107, 122; 361/820
See application file for complete search history.

(56) References Cited

U.S. PATENT DOCUMENTS

| 7,514,783 | B2 | 4/2009 | Shimokawa et al. | |
|---|---|---|---|---|
| 2004/0004272 | A1* | 1/2004 | Luo et al. | 257/666 |
| 2007/0257708 | A1 | 11/2007 | Shimokawa et al. | |
| 2007/0278516 | A1 | 12/2007 | Hashimoto et al. | |
| 2010/0133674 | A1* | 6/2010 | Hebert et al. | 257/686 |
| 2010/0187605 | A1* | 7/2010 | Haeberlen et al. | 257/337 |
| 2011/0049580 | A1* | 3/2011 | Lui et al. | 257/262 |

OTHER PUBLICATIONS

T. Hashimoto et al.; System in Package with Mounted Capacitor for Reduced Parasitic Inductance in Voltage Regulators; IEEE; 2008; pp. 187-191.
Intel Coroporation; DrMOS Specifactions; Intel Corporation; 2004.

* cited by examiner

*Primary Examiner* — Tuan T Dinh
*Assistant Examiner* — Mukund G Patel
(74) *Attorney, Agent, or Firm* — Rennie William Dover

(57) ABSTRACT

A semiconductor component and a method of manufacturing the semiconductor component that reduces parasitic elements. A semiconductor chip is coupled to a semiconductor chip receiving area of a support structure. The semiconductor chip has at least two power semiconductor devices. A drain contact of a first power semiconductor device is coupled to a source contact of a second power semiconductor device and the drain and source contacts of the first and second power semiconductor devices are joined to the semiconductor chip receiving area. Another semiconductor chip may be bonded to a second semiconductor chip receiving area of the support structure. An energy storage element may be coupled between the source contact of the first power semiconductor device and the drain contact of the second semiconductor device. A protective structure may be formed over the semiconductor chips and the energy storage element.

16 Claims, 10 Drawing Sheets

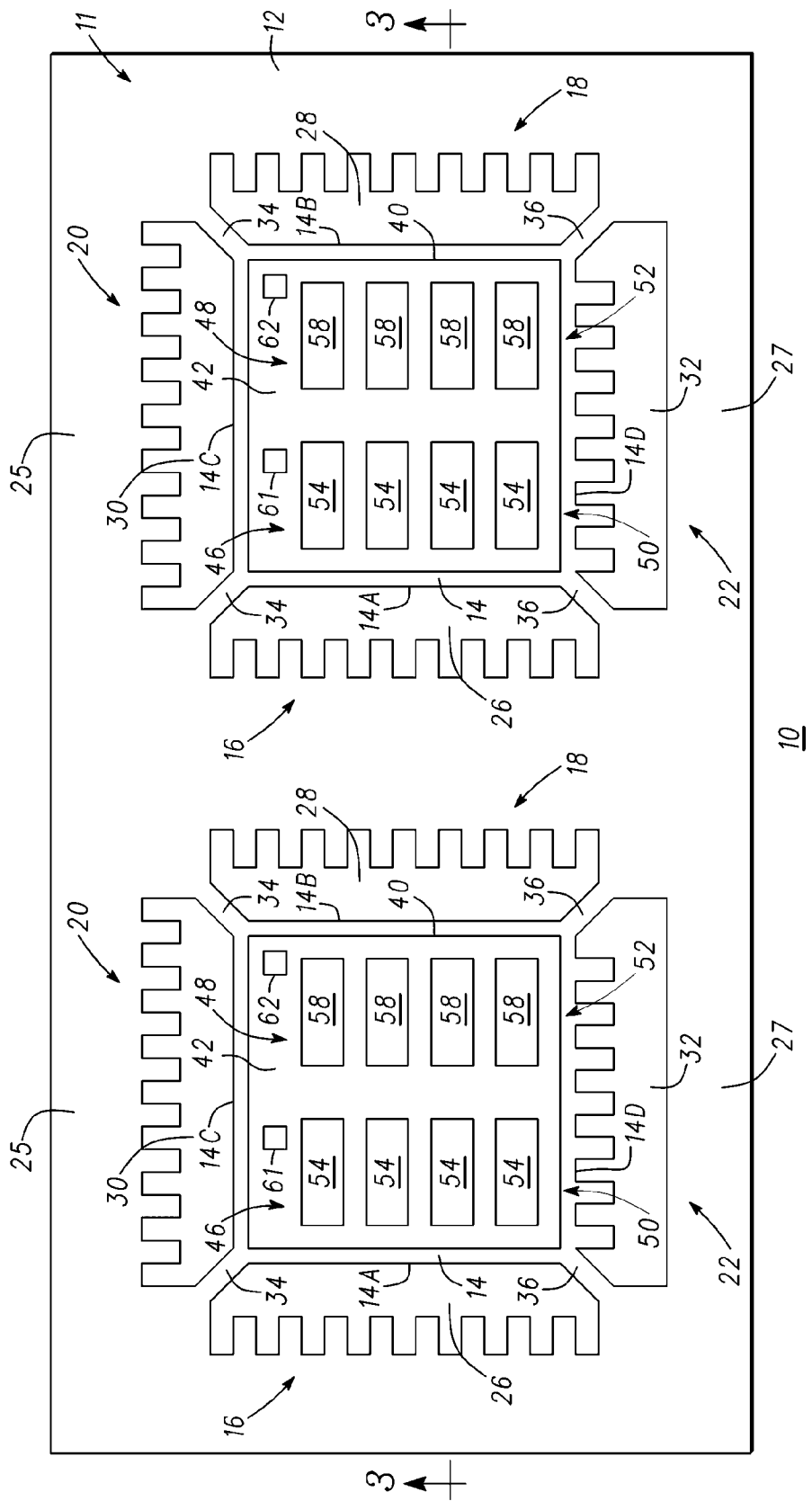

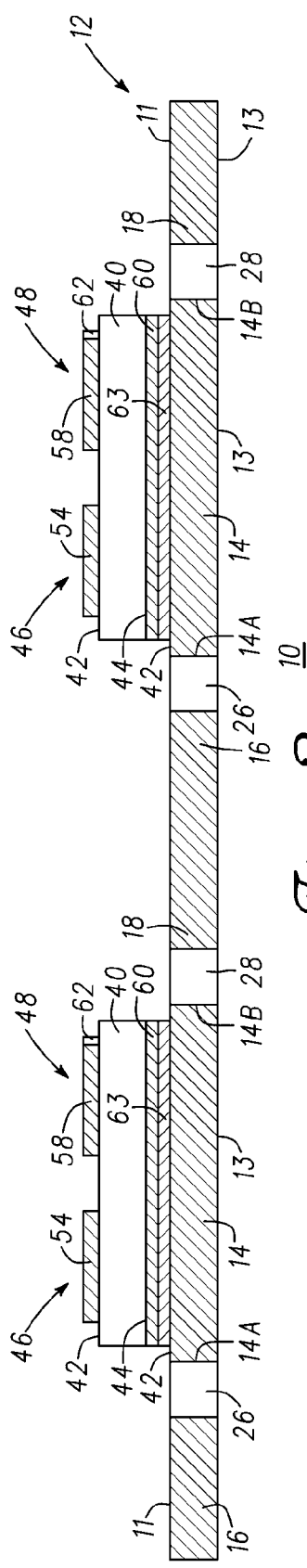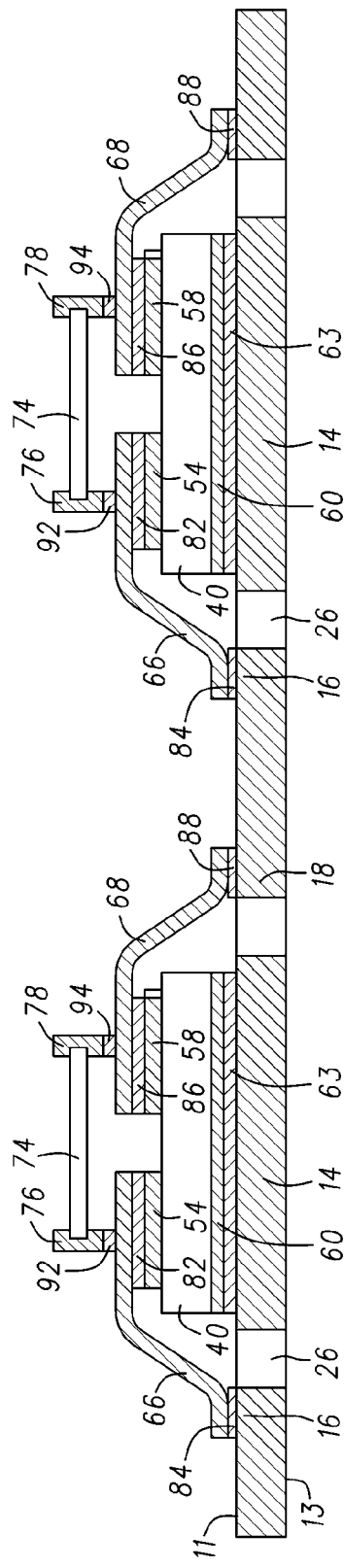

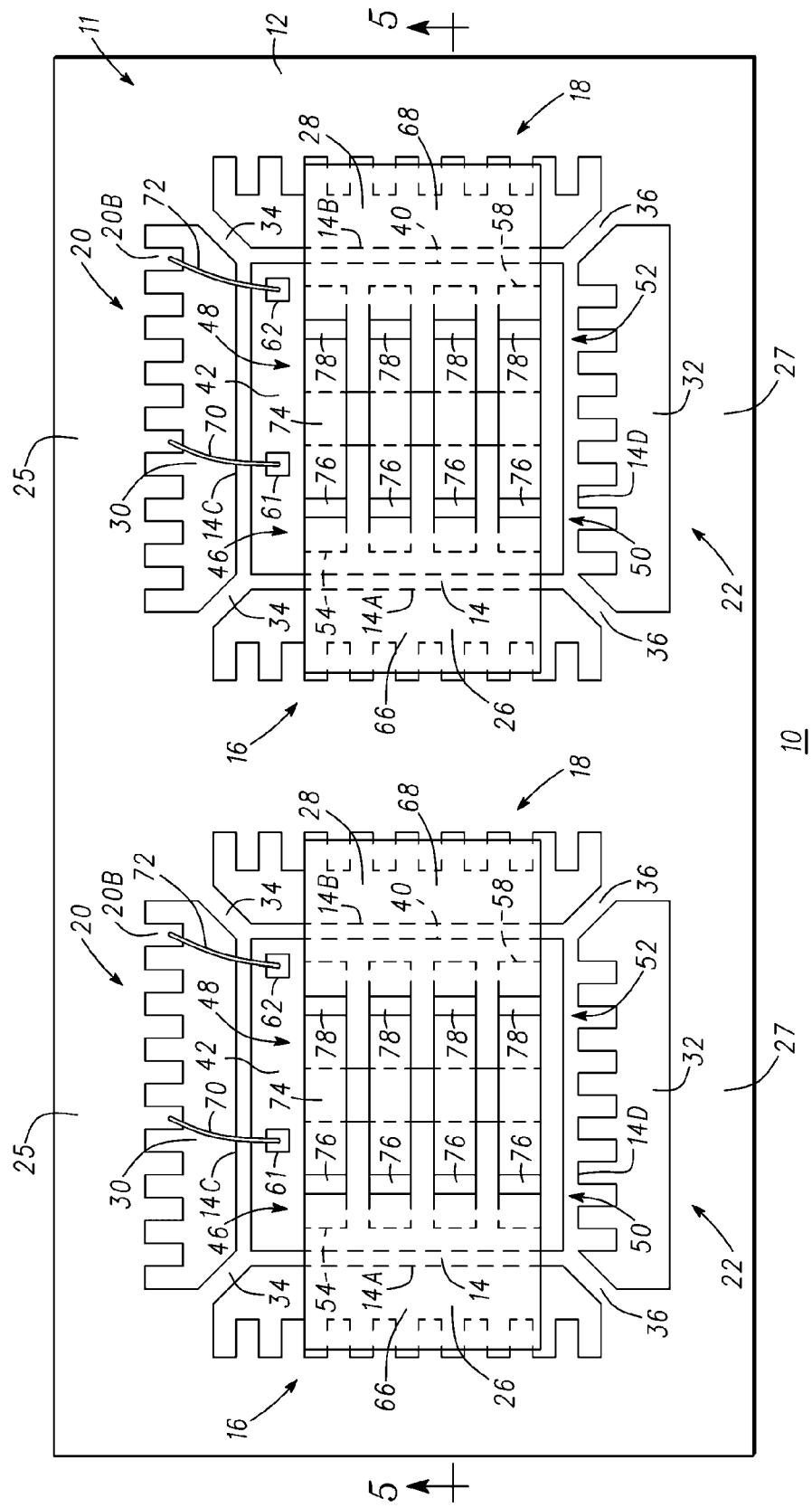

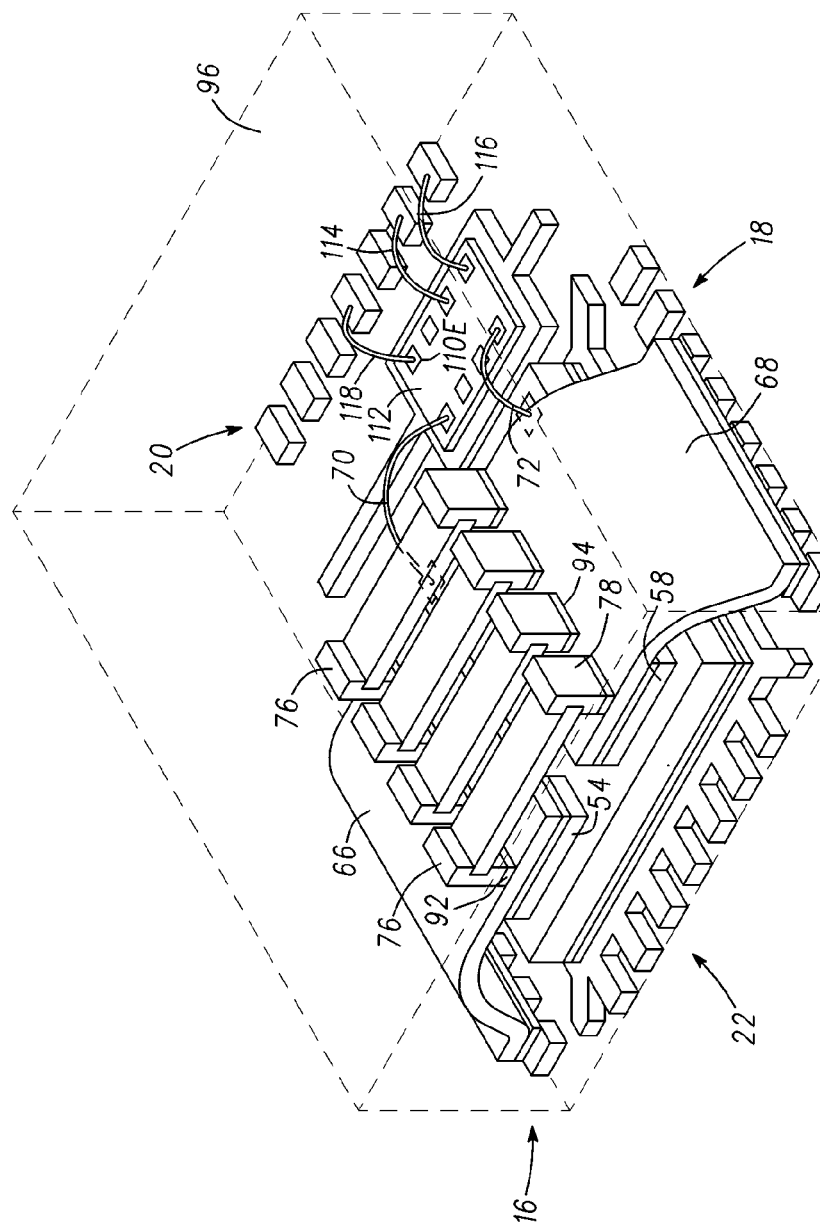
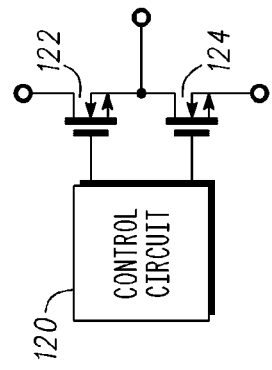

us 8,582,317 B2

METHOD FOR MANUFACTURING A SEMICONDUCTOR COMPONENT AND STRUCTURE THEREFOR

TECHNICAL FIELD

The present invention relates, in general, to semiconductor components and, more particularly, to semiconductor component packaging.

BACKGROUND

Semiconductor components may be used in applications such as voltage regulators. In a voltage regulator, two separate packaged field effect transistors are coupled together to form a switching network having a switching node that is typically coupled to an output terminal through an inductor. It is desirable for the switching network to have a small form factor for both portable and non-portable applications. The form factor may be decreased by decreasing the size of the field effect transistors and increasing the switching frequency of the switching network. This allows reducing the size of the passive components such as, for example, the inductor coupled to the output terminal. In addition to reducing the sizes of the passive components, it is desirable to reduce the sizes of the elements that contribute to the formation of interconnect parasitic passive elements such as resistances, inductances, and capacitances. Forming the switching network from discrete transistors increases the parasitic inductance distribution which increases the switching energy dissipation of the voltage regulator.

Accordingly, it would be advantageous to have a semiconductor component and a method for manufacturing the semiconductor component that allows for a smaller form factor and a reduction in the parasitic elements. It would be of further advantage for the semiconductor component to be cost efficient to manufacture.

BRIEF DESCRIPTION OF THE DRAWINGS

The present invention will be better understood from a reading of the following detailed description, taken in conjunction with the accompanying drawing figures, in which like reference characters designate like elements and in which:

FIG. 2 is a top view of the semiconductor component of FIG. 1 at a later stage of manufacture;

FIG. 3 is a cross-sectional view of the semiconductor component of FIG. 2 taken along section line 3-3 of FIG. 2;

FIG. 4 is a top view of the semiconductor component of FIGS. 2 and 3 at a later stage of manufacture;

FIG. 5 is a cross-sectional view of the semiconductor component of FIG. 4 taken along section line 5-5 of FIG. 4;

FIG. 11 is an isometric view of the semiconductor component of FIG. 10 after encapsulation and singulation; and FIG. 12 is a circuit schematic of the semiconductor component of FIG. 11.

DETAILED DESCRIPTION

In general, the present invention includes a semiconductor component and methods for manufacturing the semiconductor component that reduce parasitic elements such as, for example, parasitic inductances in the semiconductor component. In accordance with embodiments of the present invention, the semiconductor component includes a semiconductor chip having at least two power semiconductor devices manufactured in or from the same semiconductor material. A first semiconductor device of the at least two semiconductor devices comprises first and second current carrying conductors and a control conductor and a second semiconductor device comprises first and second current carrying conductors and a control conductor. The first current carrying conductor of the first semiconductor device and the second current carrying conductor of the second semiconductor device are adjacent the first major surface and electrically coupled to each other. The second current carrying conductor of the first semiconductor device and the first current carrying conductor of the second semiconductor device are adjacent to a second major surface. The first current carrying conductor of the first semiconductor device and the second current carrying conductor of the second semiconductor device are coupled to a semiconductor chip receiving area of a support structure.

In accordance with an aspect, the first current carrying conductor of the first semiconductor device is a drain conductor and the second current carrying conductor of the second semiconductor device is a source conductor.

In accordance with another aspect, the support structure includes a second semiconductor chip receiving area and a semiconductor chip is coupled to the second semiconductor chip receiving area. By way of example, the semiconductor chip coupled to the second semiconductor chip receiving area includes an integrated circuit capable of controlling the first and second power semiconductor devices.

Figure 1:
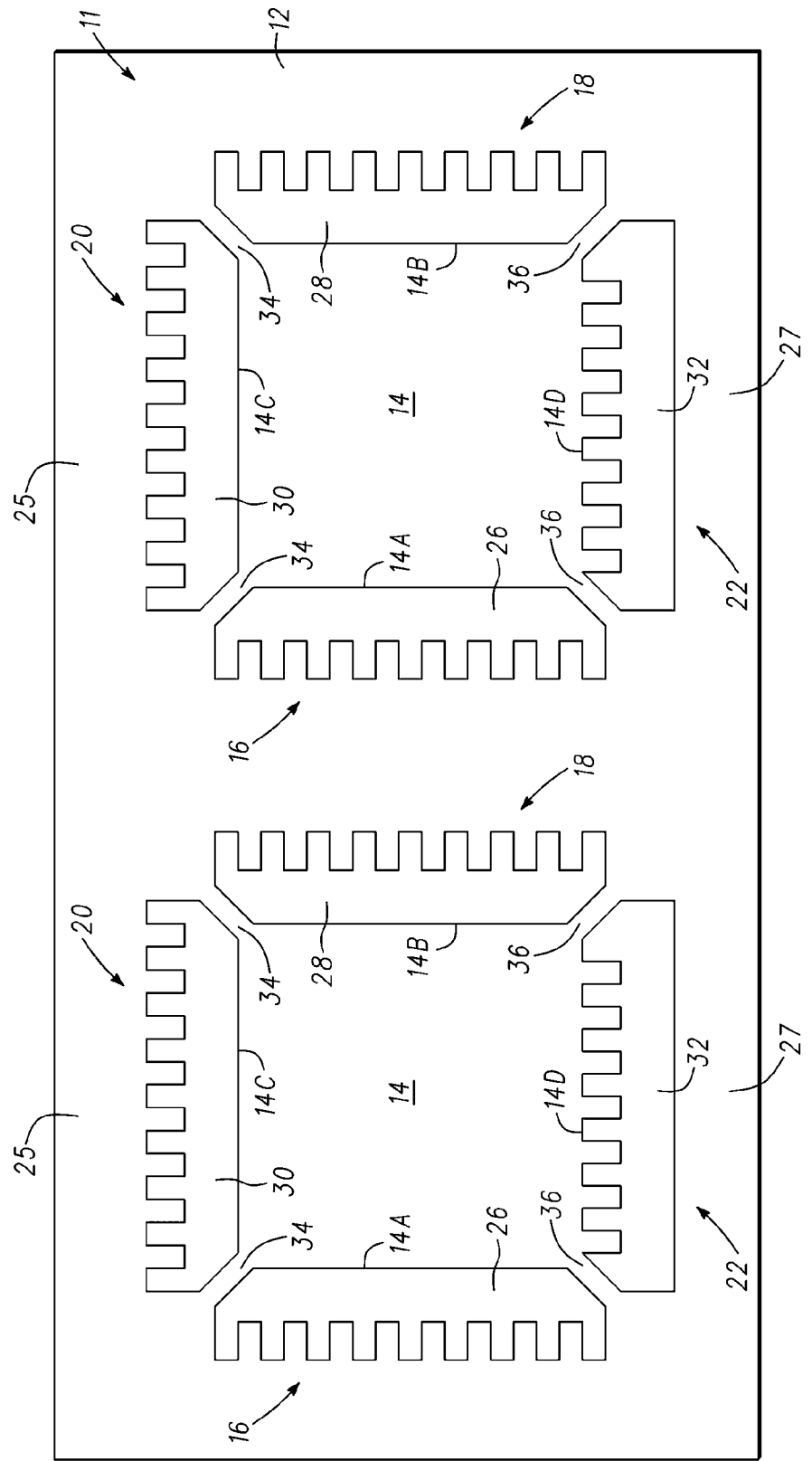
FIG. 1 is a top view of a support structure used in the manufacture of a semiconductor component in accordance with an embodiment of the present invention.

FIG. 1 is a top view of a portion of a support 12 used in the manufacture of semiconductor components in accordance with embodiments of the present invention. Support 12 may be referred to as a support structure. What is shown in FIG. 1 is support 12 which has surfaces 11 and 13 (surface 13 is shown in FIG. 3), semiconductor chip receiving areas 14, contact fingers 16, 18, 20, and 22, semiconductor chip receiving area surfaces 24, and rails 25 and 27. By way of example, support 12 is a leadframe strip and contact fingers 16, 18, 20, and 22 are leadframe leads. Leadframe strip 12 may be referred to as a leadframe. When support 12 is comprised of an electrically conductive material it may be referred to as an electrically conductive support. Semiconductor chip receiving areas 14 have opposing sides 14A and 14B and opposing sides 14C and 14D. Side 14A is spaced apart from leadframe leads 16 by an opening 26, side 14B is spaced apart from leadframe leads 18 by an opening 28, and side 14C is spaced apart from leadframe leads 20 by an opening 30. Leadframe leads 16 extend into opening 26, leadframe leads 18 extend into opening 28, leadframe leads 20 extend into opening 30, and leadframe leads 22 extend into an opening 32. Tie bars or tabs 34 extend from semiconductor chip receiving areas 14 through openings 26 and 30 or openings 28 and 30 towards rail 25 and tie bars or tabs 36 extend from semiconductor chip receiving areas 14 through openings 26 and 32 or openings 28 and 32 toward rail 27. Although leadframe leads 22 are shown as extending from semiconductor chip receiving areas 14, this is not a limitation of the present invention. Alternatively, leadframe leads 22 may extend from rail 27 into openings 32, or one or more of the set of leadframe leads 16, 18, and 20 may extend from sides 14A, 14B, and 14C, respectively, of semiconductor chip receiving areas 14. It should be noted that when electrically conductive support 12 is a leadframe strip, semiconductor chip receiving areas 14 may be referred to as flags or paddles. Techniques for manufacturing electrically conductive support structures are known to those skilled in the art. Although support 12 has been described as a metal leadframe, this is not a limitation of the present invention. Other suitable materials for support 12 include organic laminate substrates, ceramic substrates, or the like.

Referring now to FIG. 2, semiconductor chips 40 having opposing major surfaces 42 and 44 are coupled to corresponding semiconductor chip receiving areas 14. Although two semiconductor chip receiving areas 14 and two semiconductor chips 40 are shown in FIG. 2, those skilled in the art are aware that a leadframe strip typically includes more than two semiconductor chip receiving areas. The number of semiconductor chip receiving areas 14 included in support 12 is not a limitation of the present invention. Semiconductor chips 40 may be referred to as semiconductor die and semiconductor chip receiving areas 14 may be referred to as semiconductor die receiving areas. Each semiconductor chip 40 comprises a unitary semiconductor material having opposing major surfaces 42 and 44 (surface 44 is shown in FIG. 3) that includes at least two semiconductor devices 46 and 48. Power semiconductor device 46 is formed in a portion 50 of semiconductor chip 40 and has a source contact 54 formed on or from a portion of surface 42 and a drain contact 60 formed on or from a portion of surface 44. Power semiconductor device 48 is formed in a portion 52 of semiconductor chip 40 and has a drain contact 58 formed on or from a portion of surface 42 and a source contact 60 formed on or from a portion of surface 44. The drain contact of semiconductor device 46 is coupled to a portion of semiconductor chip receiving area 14 and the source contact of semiconductor device 48 is coupled to another portion of semiconductor chip receiving area 14. It should be noted that semiconductor devices 46 and 48 are formed from a common semiconductor material and that the drain contact of semiconductor device 46 is electrically coupled to the source contact of semiconductor device 48. Thus, the drain contact of semiconductor device 46 and the source contact of semiconductor device 48 share a common reference character 60 and are shown as a unitary structure in FIG. 3.

Semiconductor device 46 has a gate contact 61 formed on or from surface 42 of portion 50 of semiconductor chip 40 and semiconductor device 48 has a gate contact 62 formed on or from surface 42 of portion 52 of semiconductor chip 40.

Semiconductor chips 40 may be vertical Metal-Oxide Semiconductor Field Effect Transistors (MOSFETS), MOSFETS, Insulated Gate Bipolar Transistors (IGBTS), Junction Field Effect Transistors (JFETS), or the like. It should be noted that gate conductors or terminals of a field effect transistor may be referred to as a control conductor or a control terminal and the drain and source conductors or terminals may be referred to as current carrying conductors or current carrying terminals. Likewise, the base conductors or terminals of a bipolar junction transistor may be referred to as a control conductor, a control terminal, or a control electrode, and the collector and emitter conductors or terminals may be referred to as current carrying conductors, current carrying terminals, or current carrying electrodes.

Briefly referring to FIG. 3, a cross-sectional view of semiconductor component 10 during manufacture and taken along section line 3-3 of FIG. 2 is shown. FIG. 3 illustrates semiconductor chips 40 coupled to corresponding semiconductor chip receiving areas 14, where source and drain contacts 60 of semiconductor devices 46 and 48 are coupled to semiconductor chip attach regions 14. In particular, source and drain contacts 60 are soldered to semiconductor chip attach regions 14 using solder 63. Although semiconductor chips 40 have been described as being soldered to semiconductor chip receiving areas 14, this is not a limitation of the present invention. Other suitable materials for coupling semiconductor chips 40 to semiconductor chip receiving areas 14 include electrically conductive materials such as, for example, an electrically conductive epoxy or the like.

FIG. 4 illustrates a top view of semiconductor component 10 further along in manufacture. What is shown in FIG. 4 are electrically conductive structures 66 electrically connecting source contacts 54 to corresponding leadframe leads 16, electrically conductive structures 68 electrically connecting drain contacts 58 to corresponding leadframe leads 18, electrically conductive structures 70 electrically connecting gate contacts 61 to leadframe leads 20A of the plurality leadframe leads 20, and electrically conductive structures 72 connecting gate contacts 62 to leadframe leads 20B of the plurality of leadframe leads 20. By way of example, electrically conductive structures 66 and 68 are electrically conductive clips and electrically conductive structures 70 and 72 are wires such as, for example, gold wires, copper wires, aluminum wires, or the like. Suitable materials for electrically conductive clips 66 and 68 include copper, gold, aluminum, or the like. It should be noted that electrically conductive structures 66 and 68 are not limited to being electrically conductive clips. Other suitable electrically conductive structures include wirebonds, ribbon bonds, or the like.

Energy storage elements 74 having electrodes 76 and 78 are coupled to electrically conductive clips 66 and 68. Energy storage elements 74 may be capacitors, inductors, charge storage elements, or the like. It should be noted that coupling energy storage elements 74 to electrically conductive clips 66 and 68 is optional and that semiconductor components can be made without energy storage elements 74. The number of energy storage elements 74 coupled to electrically conductive clips 66 and 68 is not a limitation of the present invention. For example, there may be zero, one, two, three, or more energy storage elements coupled to electrically conductive clips 66 and 68. By way of example, energy storage elements 74 are chip capacitors having electrodes 76 and 78 soldered to electrically conductive clips 66 and 68 by solder 92 and 94, respectively (solder 92 and 94 is shown in FIG. 5).

FIG. 5 is a cross-sectional view of semiconductor component 10 during manufacture taken along section line 5-5 of FIG. 4. FIG. 5 further illustrates electrically conductive clips 66 having portions soldered to source contacts 54 of semiconductor chips 40 by solder 82 and portions soldered to leadframe leads 16 by solder 84. FIG. 5 also illustrates electrically conductive clips 68 having portions soldered to source contacts 58 of semiconductor chips 40 by solder 86 and portions soldered to leadframe leads 18 by solder 88. In addition, FIG. 5 illustrates chip capacitors 74 electrically coupled to electrically conductive clips 66 and 68.

Figure 6:
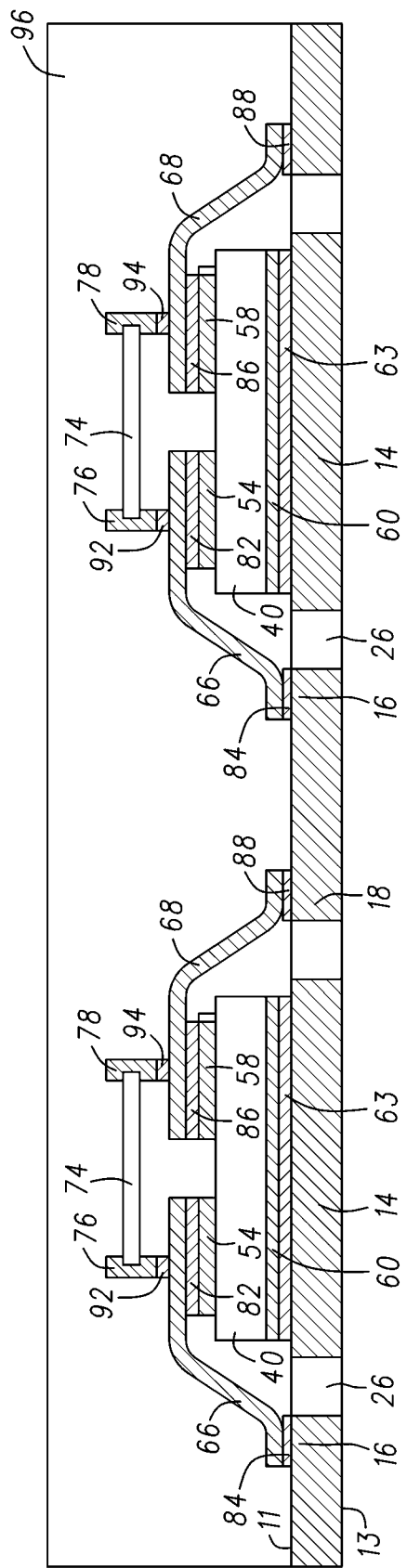
FIG. 6 is a cross-sectional view of the semiconductor component of FIG. 5 at a later stage of manufacture.

After coupling chip capacitors 74 to electrically conductive structures 66 and 68, leadframe strip 12 is placed in a mold cavity (not shown). A mold compound may be injected into the mold cavity to form a protective structure or protective material over semiconductor chips 40, electrically conductive structures 66 and 68, and chip capacitors 74, thereby forming a molded leadframe strip. FIG. 6 is a cross-sectional view of semiconductor components 10 after formation of a mold compound 96 over semiconductor chips 40, electrically conductive structures 66 and 68, and energy storage elements 74. In addition, FIG. 6 shows mold compound 96 in portions of openings 26 and 28, which were described and shown with reference to FIG. 1. It should be noted that the type of protective structure is not limited to being a mold compound but can be a metal cap, a plastic cap, etc.

Figure 7:
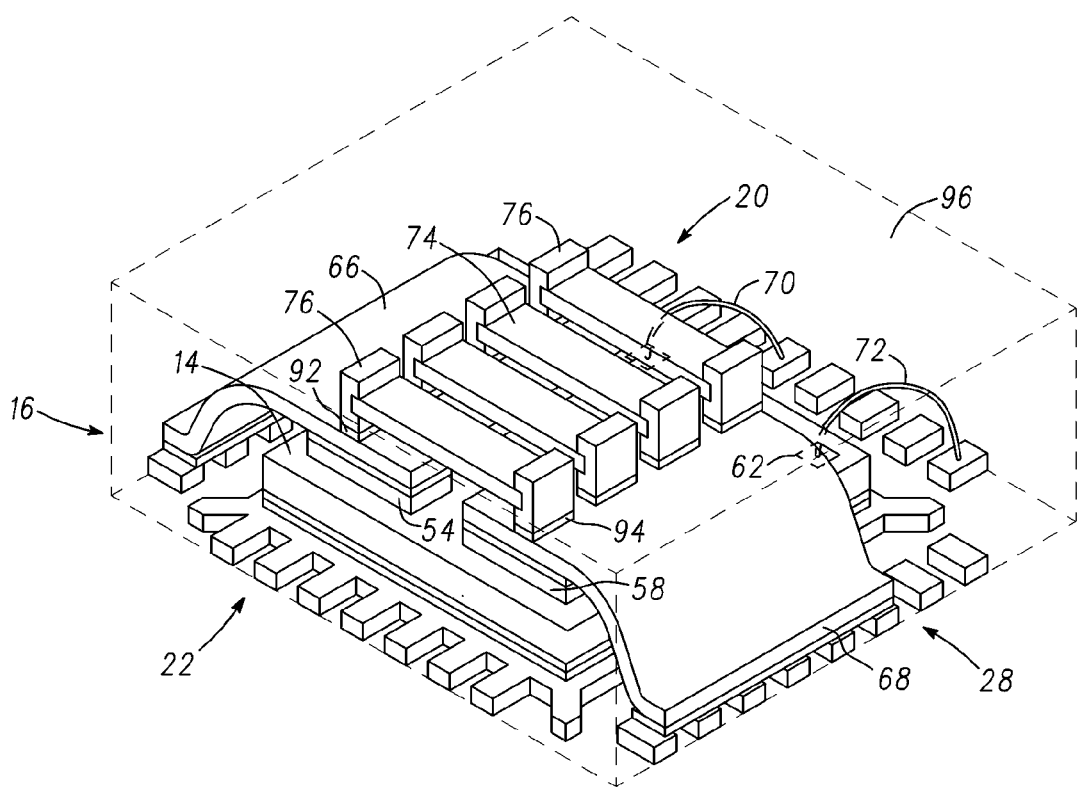
FIG. 7 is an isometric view of the semiconductor component of FIG. 6 after encapsulation and singulation.

FIG. 7 is an isometric view of a semiconductor component 10 after formation of mold compound 96 over semiconductor chips 40, electrically conductive structures 66 and 68, and energy storage elements 74 and singulation into individual semiconductor components 10.

Figure 8:
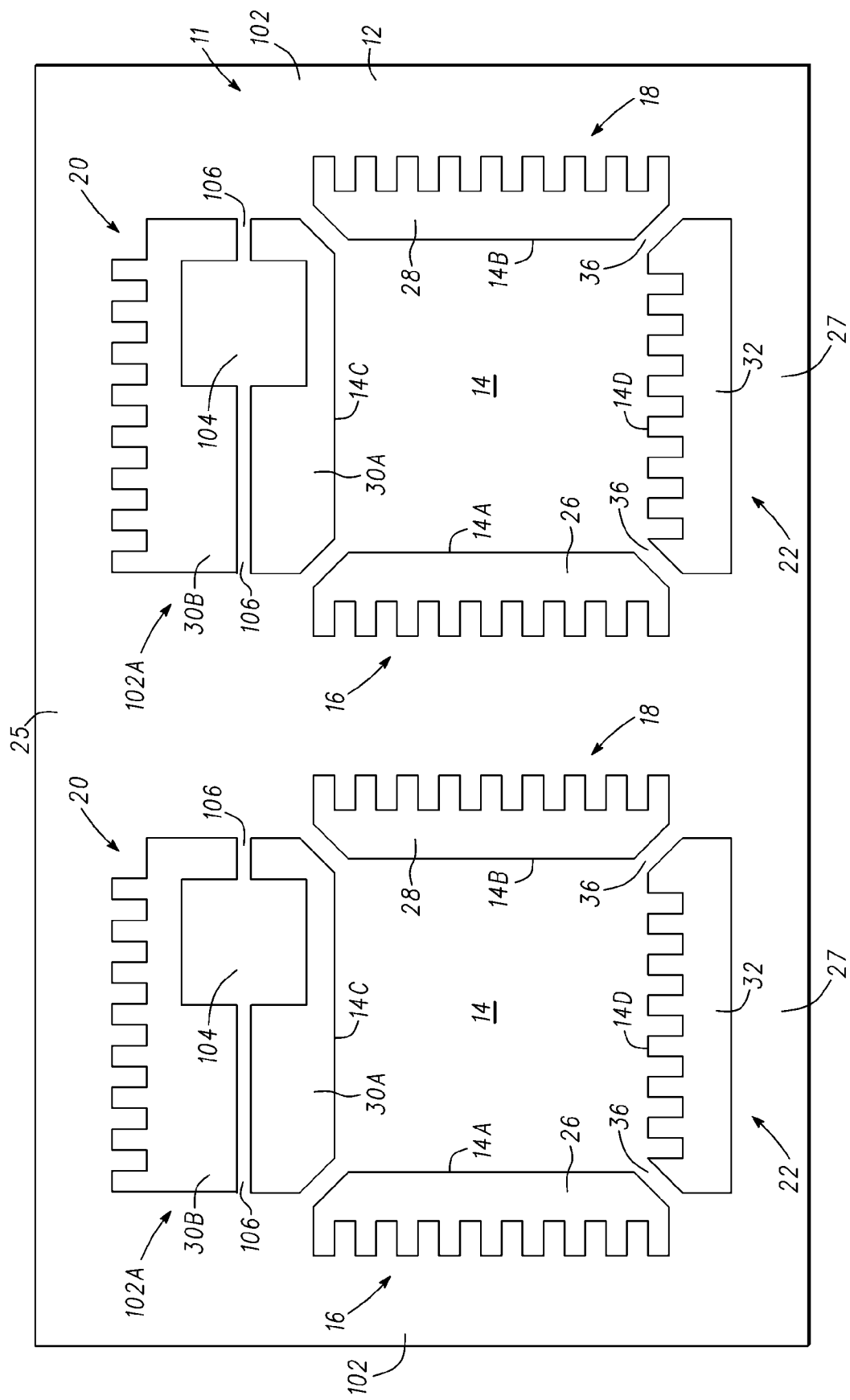
FIG. 8 is a top view of a support structure used in the manufacture of a semiconductor component in accordance with another embodiment of the present invention.

FIG. 8 is a top view of a portion of a support structure 102 used in the manufacture of semiconductor components in accordance with embodiments of the present invention. Reference character 102 has been used to identify the support structure because it differs from support structure 12 by the addition of semiconductor chip receiving areas 104. Like support structure 12, which has been described with reference to FIG. 1, support structure 102 has semiconductor chip receiving areas 14, contact fingers 16, 18, 20, and 22, semiconductor chip receiving area surfaces 24, openings 26, 28, and 32, and rails 25 and 27. Support structure 102 has semiconductor chip receiving areas 104 which are coupled to portions 102A of support structure 102 by tabs 106. Portions 102A are also referred to as support portions. Semiconductor chip receiving areas 104 are spaced apart from sides 14C by openings 30A and from leadframe leads 20 by openings 30B. Contact fingers extend into openings 30B. By way of example, support structure 102 is a leadframe strip and contact fingers 16, 18, 20, and 22 are leadframe leads. Thus support structure 102 may be an electrically conductive support. Semiconductor chip receiving areas 14, contact fingers 16, 18, 20, and 22, sides 14A, 14B, 14C, and 14D, and openings 26, 28, and 32 have been described with reference to FIG. 1. Although leadframe leads 22 are shown as extending from semiconductor chip receiving areas 14, this is not a limitation of the present invention. Alternatively, leadframe leads 22 may extend from rail 27, or one or more of the set of leadframe leads 16, 18, and 20 may extend from sides 14A, 14B, and 14C, respectively, of semiconductor chip receiving areas 14. It should be noted that when electrically conductive support structure 102 is a leadframe strip, semiconductor chip receiving areas 14 and 104 may be referred to as flags or paddles. Leadframe strip 102 may be referred to as a leadframe. Techniques for manufacturing electrically conductive support structures are known to those skilled in the art. Although support structure 102 has been described as a metal leadframe, this is not a limitation of the present invention. Other suitable materials for support structure 102 include organic laminate substrates, ceramic substrates, or the like.

Figure 9:
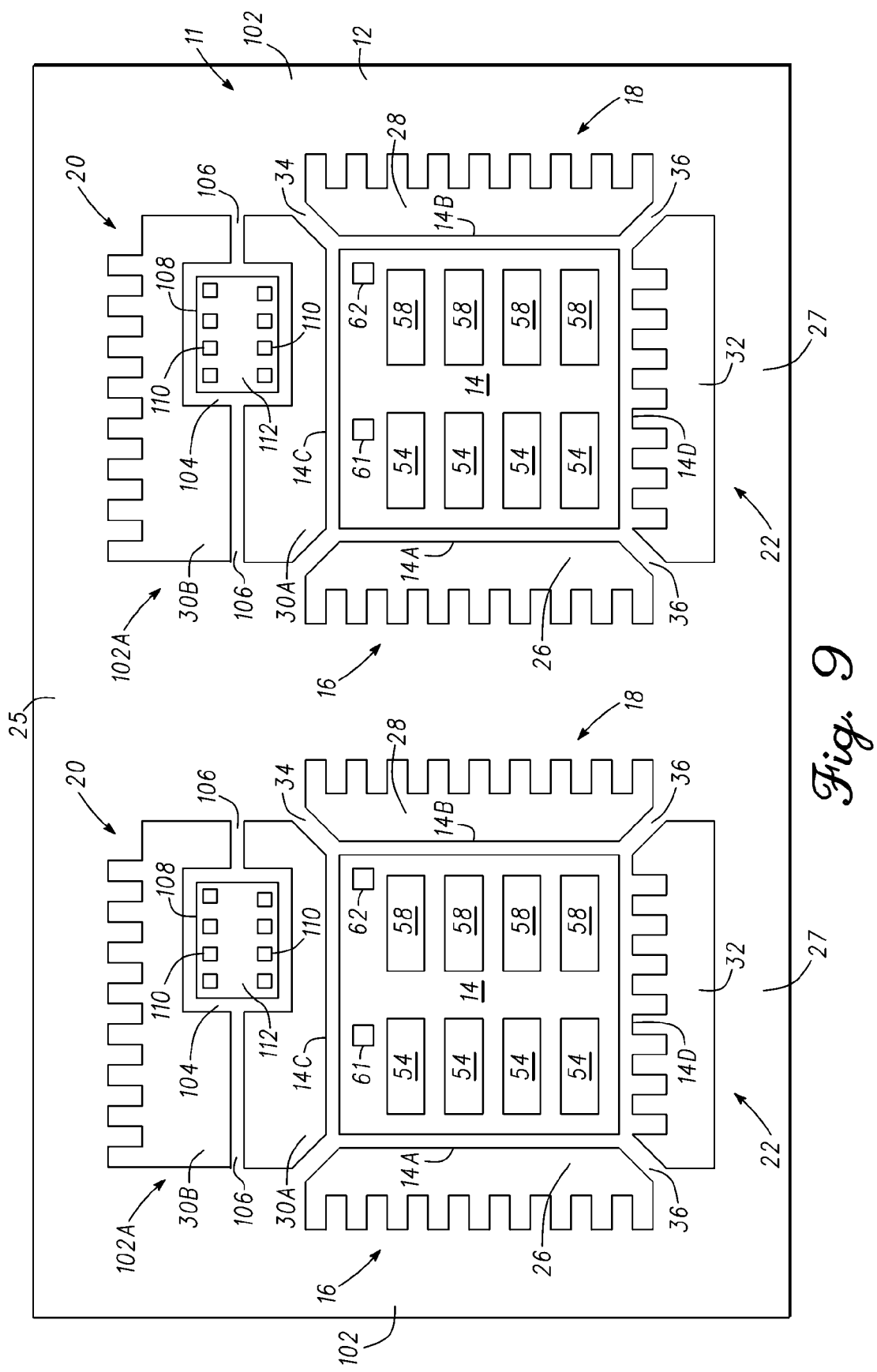
FIG. 9 is a top view of the semiconductor component of FIG. 8 at a later stage of manufacture.

Referring now to FIG. 9, semiconductor chips 40 are coupled to corresponding semiconductor chip receiving areas 14 and semiconductor chips 108 are coupled to corresponding semiconductor chip receiving areas 104. Semiconductor chips 40 and the coupling of semiconductor chips to semiconductor chip receiving areas such as, for example, semiconductor chip receiving areas 104 have been described with reference to FIGS. 2 and 3. Semiconductor chips 108 comprise an integrated circuit and are coupled to corresponding semiconductor chip receiving areas 104 using, for example, a die attach material (not shown). Techniques for coupling integrated circuits to support structures such as leadframe 102 are known to those skilled in the art. Integrated circuits 108 have bond pads 110 formed from or on a surface 112. In accordance with an embodiment, integrated circuits 108 include control circuitry for controlling semiconductor devices 46 and 48.

Figure 10:
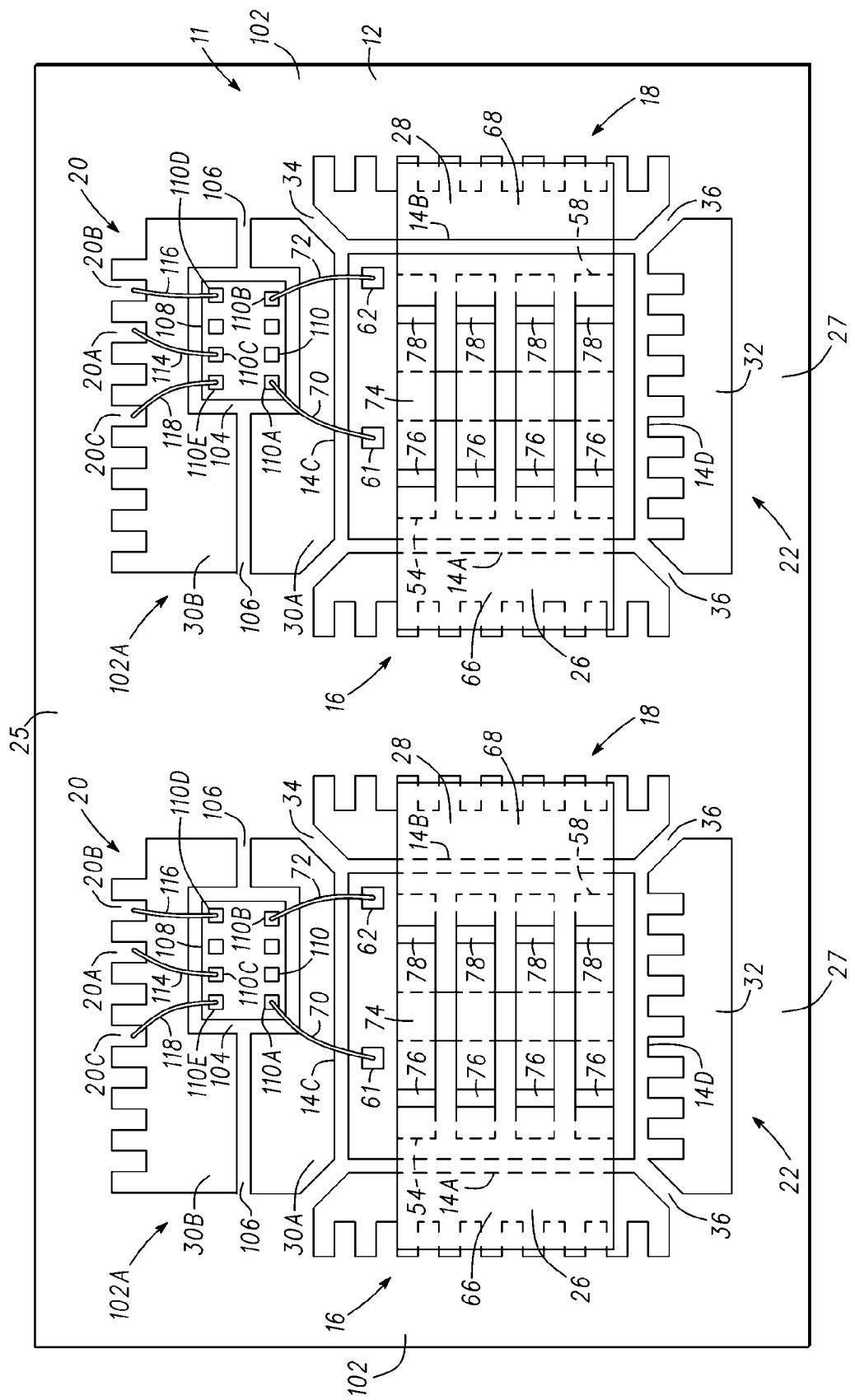
FIG. 10 is a top view of the semiconductor component of FIG. 9 at a later stage of manufacture.

Referring now to FIG. 10, electrically conductive structures 66 electrically connect source contacts 54 to corresponding leadframe leads 16, electrically conductive structures 68 electrically connect drain contacts 58 to corresponding leadframe leads 18, electrically conductive structures 70 electrically connect gate contacts 61 to bond pads 110A of the plurality of bond pads 110, and electrically conductive structures 72 electrically connect gate contacts 62 to bond pads 110B of the plurality of bond pads 110. Electrically conductive structures 114, 116, and 118 electrically connect bond pads 110C, 110D, and 110E of plurality of bond pads 110 to leadframe leads 20A, 20B, and 20C of leadframe leads 20, respectively. By way of example, electrically conductive structures 66 and 68 are electrically conductive clips and electrically conductive structures 70, 72, 114, 116, and 118 are wires such as, for example, gold wires, copper wires, aluminum wires, or the like. Suitable materials for electrically conductive clips 66 and 68 include copper, gold, aluminum, or the like. It should be noted that electrically conductive structures 66 and 68 are not limited to being electrically conductive clips. Other suitable electrically conductive structures include wirebonds, ribbon bonds, or the like.

FIG. 11 is an isometric view of a semiconductor component 100 after formation of mold compound 96 over semiconductor chips 40 and 104, electrically conductive structures 66, 68, 70, 72, 114, 116, and 118, and energy storage elements 74 and singulation into individual semiconductor components 100.

FIG. 12 is a schematic diagram of semiconductor component 100. What is shown in FIG. 12 is control circuit 120 formed from or in a semiconductor chip 108. Control circuit 120 has an output connected to a gate contact or terminal of a power Field Effect Transistor (FET) 122 and an output connected to a gate contact or terminal of a power FET 124. Semiconductor chip 40 includes power FETS 122 and 124. The source of power FET 122 is connected to the drain of power FET 124, which connection forms a node that may serve as a switching node or an output node or terminal.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for manufacturing a semiconductor component, comprising:
    providing a support structure having first and second surfaces, wherein providing the support structure comprises providing a leadframe having a first semiconductor chip receiving area and a plurality of leads;
    providing a semiconductor chip having first and second major surfaces, the semiconductor chip comprising first and second semiconductor devices, wherein the first semiconductor device comprises first and second current carrying conductors and a control conductor and the second semiconductor device comprises first and second current carrying conductors and a control conductor, the first current carrying conductor of the first semiconductor device and the second current carrying conductor of the second semiconductor device adjacent the first major surface and electrically coupled to each other, and the second current carrying conductor aft first semiconductor device and the first current carrying conductor of the second semiconductor device adjacent the second major surface;

coupling the first current carrying conductor of the first semiconductor device and the second current carrying conductor of the second semiconductor device to the first surface of the support structure;

coupling the second current carrying conductor of the first semiconductor device to a first lead of the plurality of leads with a first metal clip and coupling the first current carrying conductor of the second semiconductor device to a second lead of the plurality of leads with a second metal clip; and coupling a plurality of energy storage elements from the first clip to the second clip.

2. The method of claim 1, flutter including forming a protective structure over the semiconductor chip.

3. The method of claim 2, wherein forming the protective structure over the semiconductor chip comprises forming a mold compound over the semiconductor chip.

4. The method of claim 1, further including forming a protective structure over the plurality of energy storage elements.

5. The method of claim 1, further including coupling two energy storage elements from the first clip to the second clip.

6. The method of claim 1, wherein providing the support structure further comprises providing the leadframe having a second semiconductor chip receiving area, and further including:

coupling a second semiconductor chip to the second semiconductor chip receiving area, the second semiconductor chip having first and second major surfaces and a plurality of bond pads, the first major surface adjacent to the second semiconductor chip receiving area;

coupling a first bond pad of the plurality of bond pads to the first control conductor of the first semiconductor device;

coupling a second bond pad of the plurality of bond pads to the second control conductor of the first semiconductor chip; and coupling a third bond pad of the plurality of bond pads to a leadframe lead of the plurality of leadframe leads.

7. The method of claim 6, further including coupling at least one energy storage element from the second current carrying conductor of the first semiconductor device to the first current carrying conductor of the second semiconductor device.

8. The method of claim 7, further including forming the mold compound over the at least one energy storage element.

9. A method for manufacturing a semiconductor component, comprising:

providing a support structure having a first die receiving area and a plurality of leads;

providing a first semiconductor die having first and second major surfaces, the first semiconductor die including first and second semiconductor devices, the first semiconductor device having a gate contact, a source contact at the first major surface, a drain contact at the second major surface, the second semiconductor device having a gate contact, a drain contact at the first major surface, a source contact at the second major surface;

coupling the drain contact of a first semiconductor device to a first portion of the first die receiving area;

coupling the source contact of the second semiconductor device to a second portion of the first die receiving area;

coupling the source contact of the first semiconductor device to a first lead of the plurality of leads with a first metal clip and coupling the drain contact of the second semiconductor device to a second lead of the plurality of leads with a second metal clip; and coupling a plurality of energy storage elements from the first clip to the second clip.

10. The method of claim 9, wherein the first and second semiconductor devices are power devices.

11. The method of claim 9, further including forming a protective material over the first semiconductor die.

12. The method of claim 9, further including coupling a first and second capacitors from the source contact of the first semiconductor device to the drain contact of the second semiconductor device.

13. The method of claim 9, wherein the support structure has a second die receiving area and further including:

providing a second semiconductor die having first and second major surfaces and a plurality of bond pads at the first surface;

coupling the second major surface of the second semiconductor die to the second die receiving area;

forming a first wire bond from a first bond pad of the plurality of bonds at the first surface of the second semiconductor die to the gate contact of the first semiconductor device; and forming a second wire bond from a second bond pad of the plurality of bonds at the first surface of the second semiconductor die to the gate contact of the second semiconductor device.

14. A semiconductor component, comprising:

a support structure having a first semiconductor chip receiving area and a plurality of leadframe leads;

a first semiconductor chip having first and second major surfaces and comprising first and second semiconductor devices, wherein the first semiconductor device comprises first and second current carrying conductors and a control conductor and the second semiconductor device comprises first and second current carrying conductors and a control conductor, the first current carrying conductor of the first semiconductor device and the second current carrying conductor of the second semiconductor device adjacent the first major surface and electrically coupled to each other, and the second current carrying conductor of the first semiconductor device and the first current carrying conductor of the second semiconductor device adjacent the second major surface; the first current carrying conductor of the first semiconductor device and the second current carrying conductor of the second semiconductor device coupled to the first semiconductor chip receiving area;

a first metal clip configured to couple the second current carrying conductor of the first semiconductor device to a first lead of the plurality of leads; and a second metal clip configured to couple the first current carrying conductor of the second semiconductor device to a second lead of the plurality of leads; and a plurality of energy storage elements coupled from the first clip to the second clip.

15. The semiconductor component of claim 14, wherein the support structure further comprises a second semiconductor chip receiving area and further including a second semiconductor chip, the second semiconductor chip coupled to the second semiconductor chip receiving area and comprising a control circuit.

16. The semiconductor component of claim 15, wherein the plurality of energy storage elements comprises a first energy storage element coupled between the second current carrying conductor of the first semiconductor device and the first current carrying conductor of the second semiconductor device and a second energy storage element coupled between the second current carrying conductor of the first semiconductor device and the first current carrying conductor of the second semiconductor device.

\* \* \* \* \*